US010139427B2

(12) United States Patent
Tanaka

(10) Patent No.: US 10,139,427 B2
(45) Date of Patent: Nov. 27, 2018

(54) FUNCTIONAL DEVICE, ELECTRONIC APPARATUS, AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 183 days.

(21) Appl. No.: 14/330,282

(22) Filed: Jul. 14, 2014

(65) Prior Publication Data
US 2015/0020591 A1 Jan. 22, 2015

(30) Foreign Application Priority Data

Jul. 17, 2013 (JP) ................. 2013-148614

(51) Int. Cl.
G01P 15/08 (2006.01)
G01P 15/125 (2006.01)
G01P 1/00 (2006.01)
B81B 3/00 (2006.01)
G01C 19/5705 (2012.01)

(52) U.S. Cl.
CPC .......... G01P 15/125 (2013.01); B81B 3/0021 (2013.01); B81B 3/0072 (2013.01); G01P 1/00 (2013.01); B81B 2201/0235 (2013.01); B81B 2203/0109 (2013.01); G01C 19/5705 (2013.01); G01P 2015/0831 (2013.01)

(58) Field of Classification Search
CPC .................................................... G01P 15/125
USPC ...................................................... 73/514.32
See application file for complete search history.

(56) References Cited

U.S. PATENT DOCUMENTS

| 5,243,861 A | 9/1993 | Kloeck et al. |
| 5,488,864 A | 2/1996 | Stephan |
| 6,513,380 B2 | 2/2003 | Reeds, III et al. |
| 7,121,141 B2 | 10/2006 | McNeil |
| 2009/0031809 A1* | 2/2009 | Lin ........................ G01P 15/125 73/514.32 |
| 2010/0122578 A1* | 5/2010 | Classen ............... G01P 15/0802 73/514.32 |
| 2011/0138914 A1 | 6/2011 | Yoshida et al. |
| 2012/0017681 A1* | 1/2012 | Reinmuth ............. G01P 15/125 73/514.35 |
| 2012/0280334 A1 | 11/2012 | Yosida et al. |

FOREIGN PATENT DOCUMENTS

| CN | 102124352 A | 7/2011 |
| CN | 102667496 A | 9/2012 |
| JP | 04-116465 A | 4/1992 |
| JP | 2009-537803 A | 10/2009 |
| WO | WO-2007-131835 A1 | 11/2007 |

* cited by examiner

Primary Examiner — Walter L Lindsay, Jr.
Assistant Examiner — Philip Marcus T Fadul
(74) Attorney, Agent, or Firm — Harness, Dickey & Pierce, P.L.C.

(57) ABSTRACT

A functional device includes a movable body and a supporting section configured to support the movable body via coupling sections extending along a first axis. The supporting section includes a connection region connected to the coupling sections and provided along the first axis and contact regions provided on the outer side of the connection region in plan view and electrically connected to a wire provided on a substrate.

13 Claims, 16 Drawing Sheets

FUNCTIONAL DEVICE, ELECTRONIC APPARATUS, AND MOVING OBJECT

CROSS-REFERENCE TO RELATED APPLICATIONS

This application claims priority to Japanese Patent Application No. 2013-148614 filed on Jul. 17, 2013. The entire disclosure of Japanese Patent Application No. 2013-148614 is hereby incorporated herein by reference.

BACKGROUND

1. Technical Field

The present invention relates to a functional device, an electronic apparatus, and a moving object.

2. Related Art

In recent years, a physical quantity sensor (a functional device) has been developed that detects a physical quantity such as acceleration using, for example, a silicon MEMS (Micro Electro Mechanical Systems) technique.

For example, U.S. Pat. No. 7,121,141 (Patent Literature 1) describes a physical quantity sensor that includes a mass body displaceable about a bending axis and a fixed electrode fixed to a substrate and detects acceleration in the vertical direction on the basis of capacitance between the mass body and the fixed electrode. In the physical quantity sensor described in Patent Literature 1, the mass body is supported by a supporting body via a torsion bar.

The physical quantity sensor is manufactured by, for example, forming a recess in a glass substrate, forming a wire in the recess, anode-bonding a silicon substrate to the glass substrate to set the wire and the silicon substrate in contact with each other, patterning the silicon substrate, and forming the mass body, the supporting body, and the torsion bar. To surely set the wire and the silicon substrate in contact with each other, for example, the upper surface of the wire projects further upward than the upper surface of the glass substrate.

However, in the physical quantity sensor, it is likely that stress occurs in the supporting body when the supporting body is pushed by the wire and the stress affects the torsion bar. As a result, in the physical quantity sensor, detection sensitivity is sometimes deteriorated.

SUMMARY

An advantage of some aspects of the invention is to provide a functional device that can have high detection sensitivity. Another advantage of some aspects of the invention is to provide an electronic apparatus and a moving object including the functional device.

The invention can be implemented as the following forms or application examples.

Application Example 1

A functional device according to this application example includes: a movable body; and a supporting section configured to support the movable body via coupling sections extending along a first axis. The supporting section includes a connection region connected to the coupling sections and provided along the first axis and contact regions provided on the outer side of the connection region in plan view and electrically connected to a wire provided on a substrate.

In the functional device described above, compared with a form in which the contact regions are arranged on a support axis, it is possible to increase the distance between the contact regions and the support axis. Therefore, in the functional device, it is possible to reduce the influence on the coupling sections of a stress that occurs when the supporting body is pushed by the wire. As a result, the functional device can have high detection sensitivity.

Application Example 2

In the functional device according to this application example, at least a part of the connection region may not have to be fixed to the substrate.

In the functional device described above, a portion (the connection region) on the first axis of the supporting section in plan view is separated from the substrate. For example, when the supporting section made of silicon and the substrate made of glass are joined, in some case, stress occurs because of a difference between a coefficient of thermal expansion of the supporting section and a coefficient of thermal expansion of the substrate and affects the coupling sections. In the functional device, since the portion (the connection region) on the first axis of the supporting body is separated from the substrate, it is possible to reduce the influence on the coupling sections of the stress that occurs because of the difference between the coefficient of thermal expansion of the supporting section and the coefficient of thermal expansion of the substrate.

Application Example 3

In the functional device according to this application example, an opening section may be provided in the movable body, and the supporting section may be arranged in the opening section.

In the functional device described above, a structure including the movable body, the coupling sections, and the supporting section can be easily fixed to the substrate by one supporting section. That is, the structure is fixed to the substrate at one point (by the one supporting section). Therefore, compared with a form in which the structure is fixed to the substrate at two points (by two supporting sections), it is possible to reduce the influence on the coupling sections of, for example, stress that occurs because of a difference between a coefficient of thermal expansion of the substrate and a coefficient of thermal expansion of the structure and stress applied to an apparatus during mounting.

Application Example 4

In the functional device according to this application example, the contact regions may be provided on both sides of the connection region across the first axis in plan view.

In the functional device described above, it is possible to more surely apply potential to the movable body via the coupling sections and the supporting section.

Application Example 5

In the functional device according to this application example, the supporting section may have a shape in which a first portion extends along a second axis, which crosses the first axis, and second portions project from ends of the first portion, the connection region may be provided in the first portion, and the contact regions may be provided in the second portions.

In the functional device described above, compared with a form in which the contact regions are provided to overlap the first portion, it is possible to increase the distance between the contact regions and the first axis. Therefore, in the functional device, it is possible to more surely reduce the influence on the coupling sections of the stress that occurs when the supporting body is pushed by the wire.

Application Example 6

In the functional device according to the application example, the first portion of the supporting section may extend to both sides along the second axis across the first axis, the second portions may project from both ends of the first portion, and the contact regions may be respectively provided in the second portions.

In the functional device described above, it is possible to more surely reduce the influence on the coupling sections of the stress that occurs when the supporting body is pushed by the wire.

Application Example 7

In the functional device according to this application example, in the supporting section, first stress buffering sections may be provided between the connection region and the contact regions.

In the functional device described above, it is possible to more surely reduce the influence on the coupling sections of the stress that occurs when the supporting body is pushed by the wire.

Application Example 8

In the functional device according to this application example, at least apart of the supporting section may be connected to a post section provided in the substrate.

In the functional device described above, it is possible to firmly fix the supporting section above the substrate.

Application Example 9

In the functional device according to this application example, in the movable body, a second stress buffering section may be provided in a portion to which the coupling sections are connected.

In the functional device described above, it is possible to reduce the influence on the coupling sections of stress that occurs when the movable body is greatly displaced. As a result, it is possible to suppress the coupling sections from being damaged.

Application Example 10

In the functional device according to this application example, a hollow section may be provided in the post section, the wire may be provided in an inner bottom of the hollow section, and the contact regions may be provided to overlap the wire provided in the hollow section in plan view.

In the functional device described above, it is possible to surely set the wire and the supporting section in contact with each other even if the wire is not formed thick.

Application Example 11

An electronic apparatus according to this application example includes the functional device according to any one of the application examples 1 to 10.

In the electronic apparatus described above, since the electronic apparatus includes the functional device according to this application example, the electronic apparatus can have high detection sensitivity.

Application Example 12

A moving object according to this application example includes the functional device according to any one of the application examples 1 to 10.

In the moving object described above, since the moving object includes the functional device according to this application example, the moving object can have high detection sensitivity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention are explained in detail below with reference to the drawings. The embodiments explained below do not unduly limit contents of the invention described in the appended claims. All components explained below are not always essential constituent elements of the invention.

1. First Embodiment

1.1. Functional Device

Figure 1:
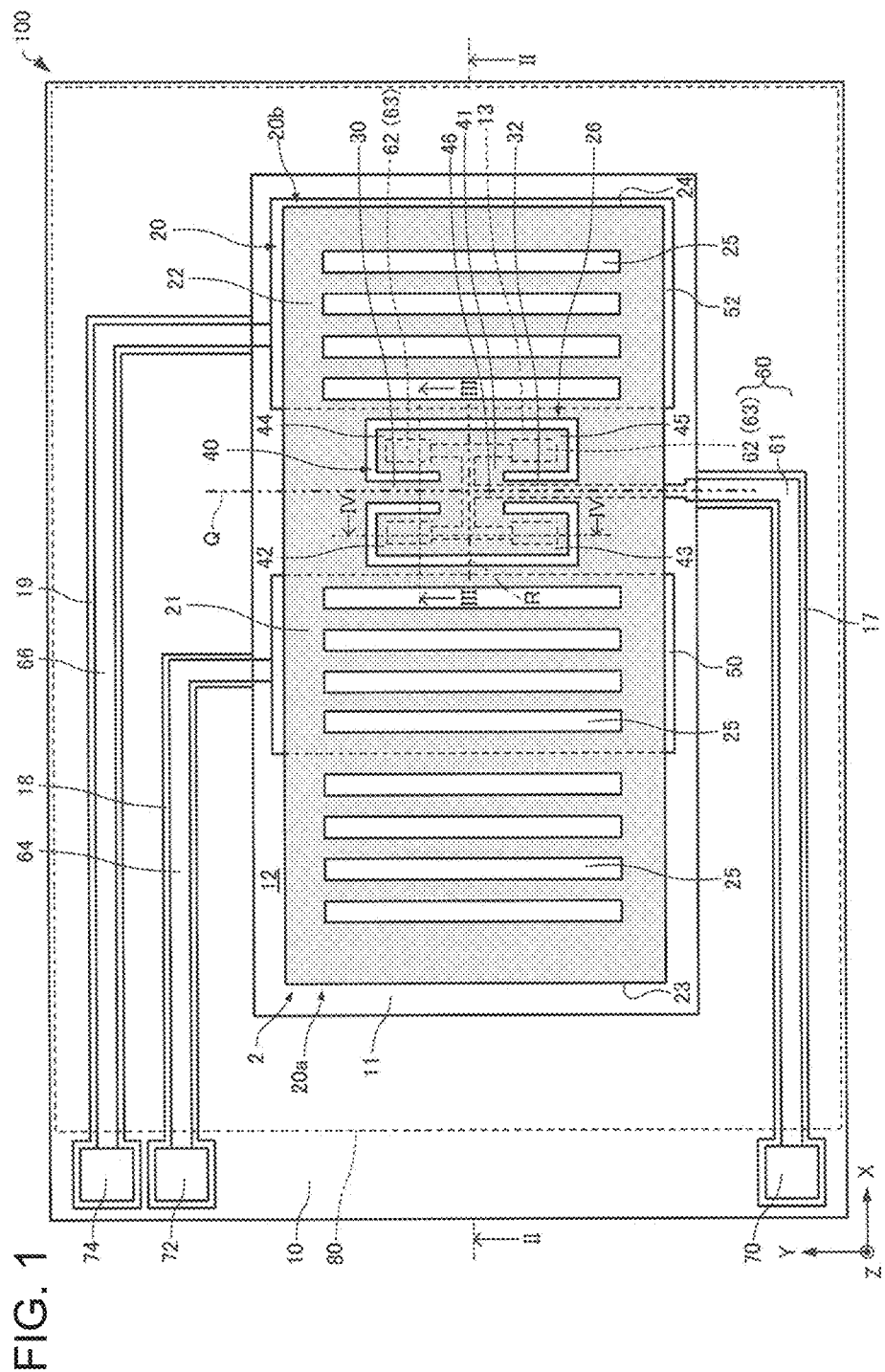
FIG. 1 is a plan view schematically showing a physical quantity sensor according to a first embodiment.
Figure 2:
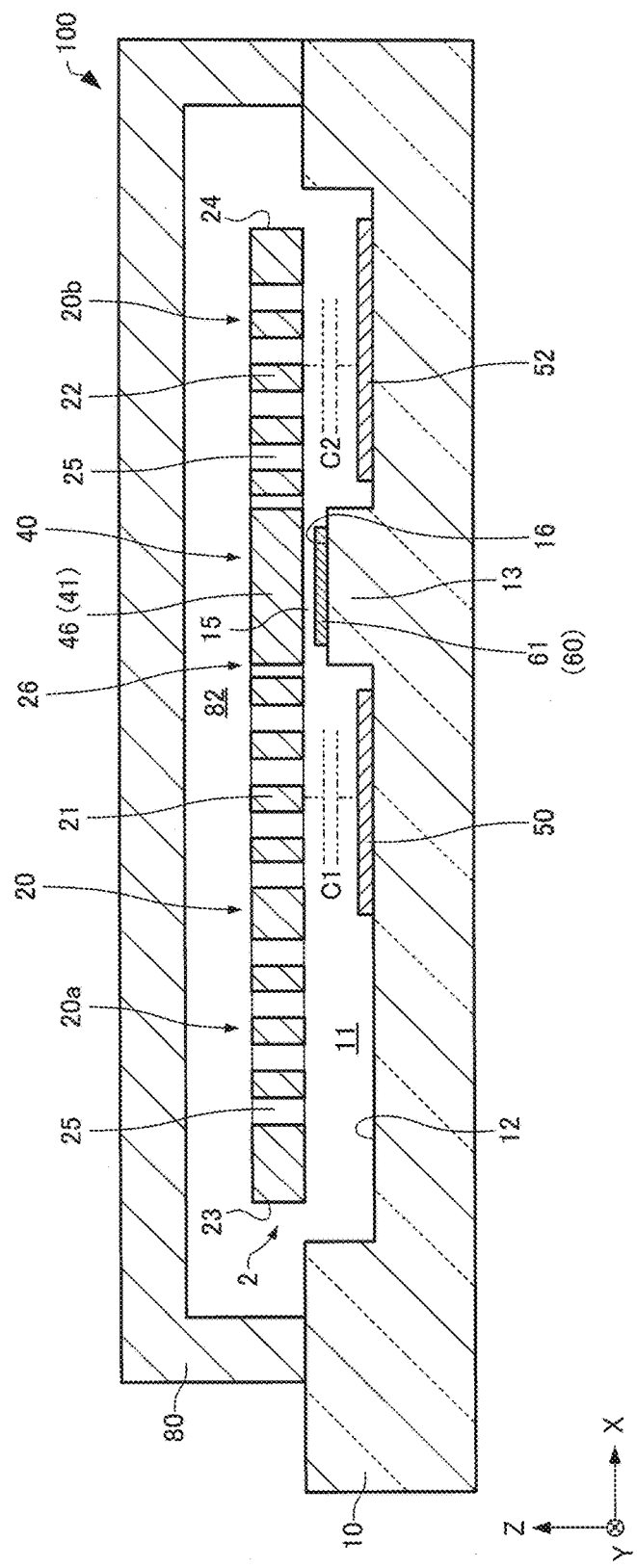
FIG. 2 is a sectional view schematically showing the physical quantity sensor according to the first embodiment.
Figure 3:
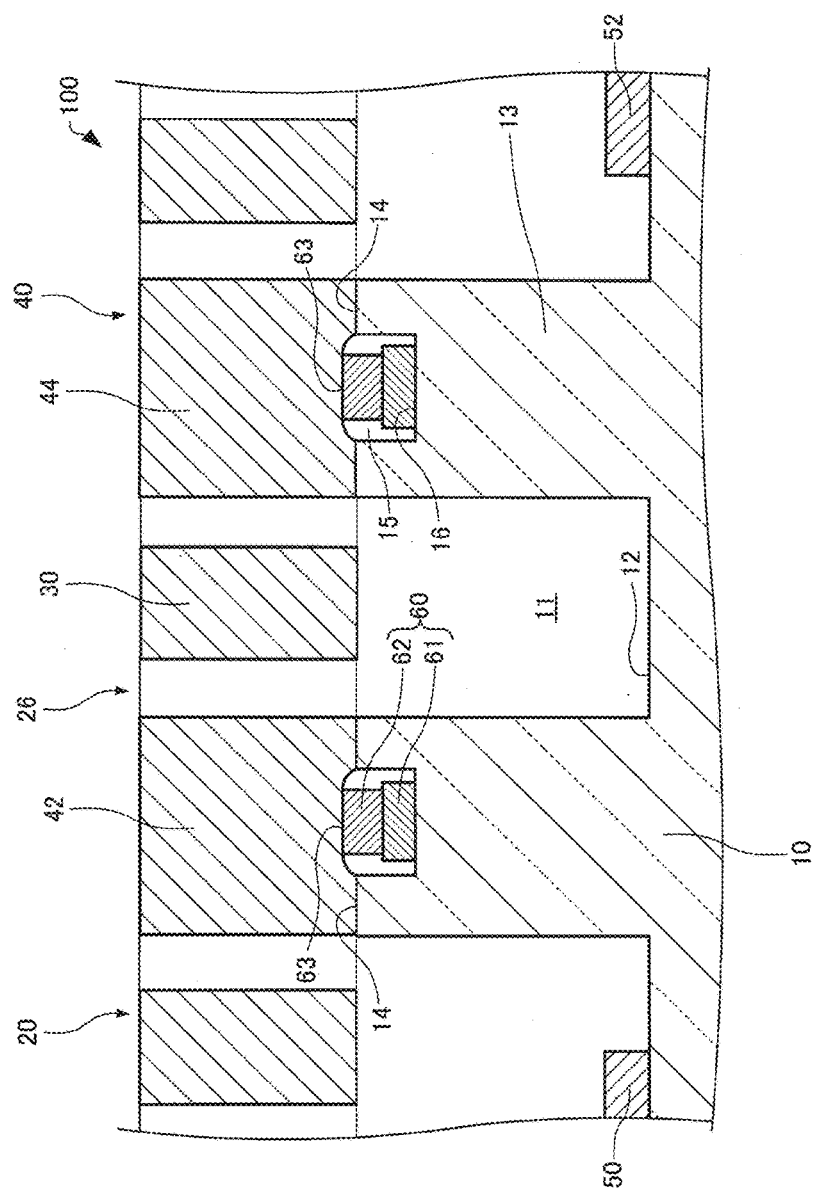
FIG. 3 is a sectional view schematically showing the physical quantity sensor according to the first embodiment.
Figure 4:
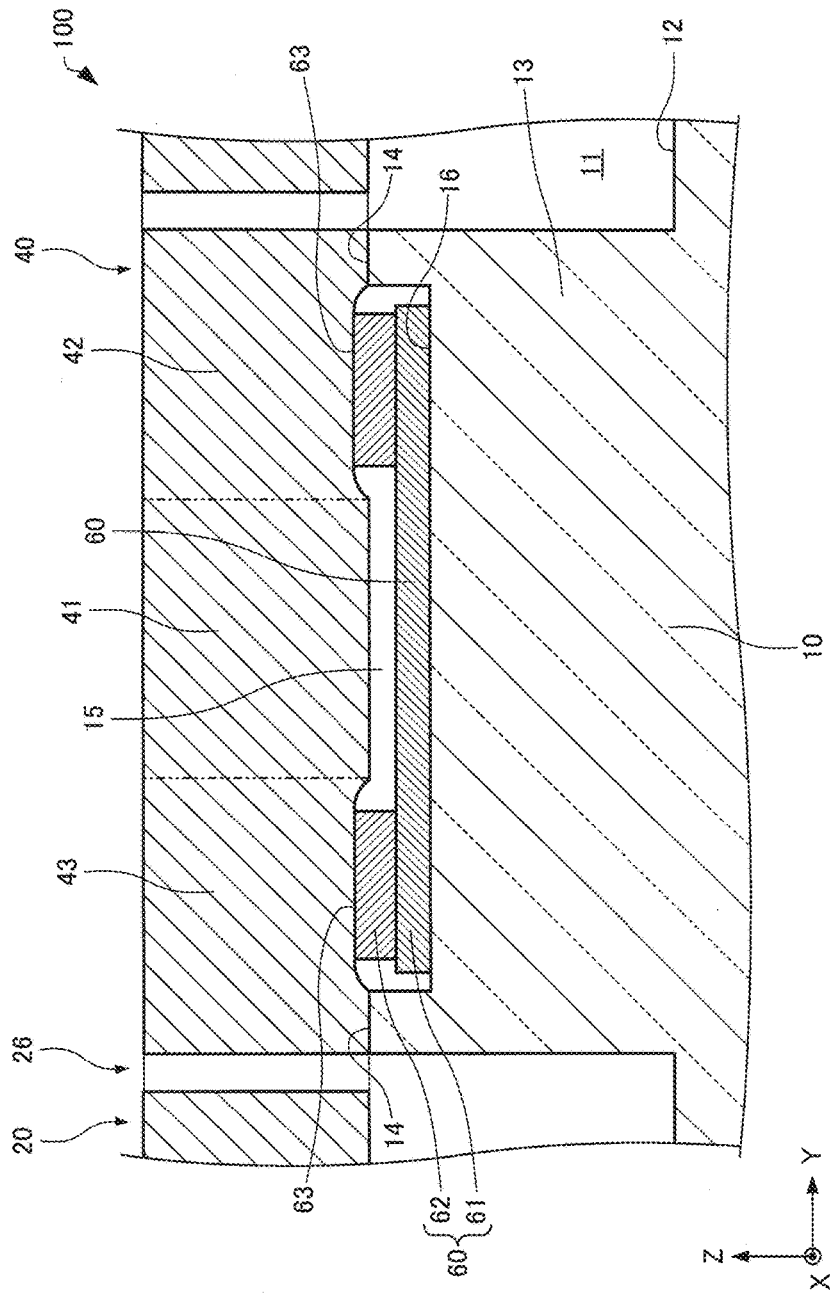
FIG. 4 is a sectional view schematically showing the physical quantity sensor according to the first embodiment.

First, a functional device according to a first embodiment is explained with reference to the drawings. FIG. 1 is a plan view schematically showing a functional device 100 according to the first embodiment. FIG. 2 is a II-II line sectional view of FIG. 1 schematically showing the functional device 100 according to the first embodiment. FIG. 3 is a III-III line sectional view of FIG. 1 schematically showing the functional device 100 according to the first embodiment. FIG. 4 is a IV-IV line sectional view of FIG. 1 schematically showing the functional device 100 according to the first embodiment.

For convenience, in FIG. 1, a lid body 80 is seen through. In FIGS. 3 and 4, the lid body 80 is not shown. In FIGS. 1 to 4, as three axes orthogonal to one another, an X axis, a Y axis, and a Z axis are shown.

The functional device 100 includes, as shown in FIGS. 1 to 4, a substrate 10, a movable body 20, first and second coupling sections 30 and 32, a supporting section 40, first and second fixed electrode sections 50 and 52, first to third wires 60, 64, and 66, first to third pads 70, 72, and 74, and the lid body 80. In an example explained below, the functional device 100 is an acceleration sensor (a capacitance-type MEMS acceleration sensor) that detects acceleration in the vertical direction (the Z-axis direction).

The material of the substrate 10 is an insulating material such as glass. For example, when the substrate 10 is made of an insulating material such as glass and the movable body 20 is made of a semiconductor material such as silicon, it is possible to easily electrically insulate the substrate 10 and the movable body 20 from each other and simplify a sensor structure.

A recess 11 is formed in the substrate 10. The movable body 20 and the coupling sections 30 and 32 are provided above the recess 11 via a gap. In an example shown in FIG. 1, a plane shape (a shape viewed from the Z-axis direction) of the recess 11 is a rectangle. A post section 13 is provided on a bottom surface 12 of the recess 11 (a surface of the substrate 10 defining the recess 11). In an example shown in FIGS. 2 to 4, the post section 13 is provided integrally with the substrate 10. The post section 13 projects further upward (in a +Z-axis direction) than the bottom surface 12. In other words, the post section 13 may be a column upstanding from the surface 12 of the substrate 10. As shown in FIGS. 3 and 4, the height of the post section 13 (the distance between an upper surface 14 of the post section 13 and the bottom surface 12) and the depth of the recess 11 are, for example, equal. The upper surface 14 of the post section 13 is joined to the supporting section 40. A hollow section 15 is formed on the upper surface 14 of the post section 13. A first wire 60 is provided on a bottom surface 16 of the hollow section 15 (a surface of the post section 13 defining the hollow section 15).

In the example shown in FIGS. 2 to 4, a side surface of the recess 11 (a side surface of the substrate 10 defining the recess 11) and a side surface of the post section 13 are perpendicular to the bottom surface 12 of the recess 11. However, the side surfaces may incline with respect to the bottom surface 12.

The movable body 20 is displaceable about a support axis (a first axis) Q. Specifically, when acceleration in the vertical direction (the Z-axis direction) is applied to the movable body 20, the movable body 20 swings in a seesaw manner with the support axis Z, which is determined by the coupling sections 30 and 32, as a rotation axis (a swing axis). The support axis Q is, for example, parallel to the Y axis. In the example shown in the figures, a plane shape of the movable body 20 is a rectangle. The thickness (the size in the Z-axis direction) of the movable body 20 is, for example, fixed.

The movable body 20 includes a first seesaw piece 20a and a second seesaw piece 20b. The first seesaw piece 20a is one of two portions of the movable body 20 divided by the support axis Q in plan view (in FIG. 1, a portion located on the left side). The second seesaw piece 20b is the other of the two portions of the movable body 20 divided by the support axis Q in plan view (in FIG. 1, a portion located on the right side).

When acceleration (e.g., gravitational acceleration) in the vertical direction is applied to the movable body 20, rotation moments (moments of force) are generated respectively in the first seesaw piece 20a and the second seesaw piece 20b. When the rotation moment (e.g., a counterclockwise rotation moment) of the first seesaw piece 20a and the rotation moment (e.g., a clockwise rotation moment) of the second seesaw piece 20b are balanced, a change does not occur in the tilt of the movable body 20 and acceleration cannot be detected. Therefore, the movable body 20 is designed such that, when the acceleration in the vertical direction is applied, the rotation moment of the first seesaw piece 20a and the rotation moment of the second seesaw piece 20b are not balanced and a predetermined tilt occurs in the movable body 20.

In the functional device 100, the support axis Q is arranged in a position deviating from the center (the center of gravity) of the movable body 20 (the distances from the support axis Q to the distal ends of the seesaw pieces 20a and 20b are set different), whereby the seesaw pieces 20a and 20b have different masses each other. That is, in the movable body 20, masses are different on one side (the first seesaw piece 20a) and the other side (the second seesaw piece 20b) across the support axis Q. In the example shown in the figures, the distance from the support axis Q to an end face 23 of the first seesaw piece 20a is larger than a distance from the support axis Q to an end face 24 of the second seesaw piece 20b. The thickness of the first seesaw piece 20a and the thickness of the second seesaw piece 20b are equal. Therefore, the mass of the first seesaw piece 20a is larger than the mass of the second seesaw piece 20b. Since the seesaw pieces 20a and 20b have the different masses each other, when the acceleration in the vertical direction is applied, it is possible to not balance the rotation moment of the first seesaw piece 20a and the rotation moment of the second seesaw piece 20b. Therefore, when the acceleration in the vertical direction is applied, it is possible to cause the predetermined tilt in the movable body 20.

Although not shown in the figures, the seesaw pieces 20a and 20b may be given the different masses each other by arranging the support axis Q in the center of the movable body 20 and setting the thicknesses of the seesaw pieces 20a and 20b different from each other. In such a case, as in the case explained above, when the acceleration in the vertical direction is applied, it is possible to cause the predetermined tilt in the movable body 20.

The movable body 20 is provided separately from the substrate 10. The movable body 20 is provided above the recess 11. In the example shown in the figures, a gap is provided between the movable body 20 and the substrate 10. The movable body 20 is provided separately from the supporting section 40 by the coupling sections 30 and 32. Consequently, the movable body 20 can swing in a seesaw manner.

The movable body 20 includes a first movable electrode section 21 and a second movable electrode section 22 provided across the support axis Q. The first movable electrode section 21 is provided in the seesaw piece 20a. The second movable electrode section 22 is provided in the second seesaw piece 20b.

The first movable electrode section 21 is a portion of the movable body 20 that overlaps the first fixed electrode section 50 in plan view. The first movable electrode section 21 forms capacitance C1 between the first movable electrode section 21 and the first fixed electrode section 50. That is, the capacitance C1 is formed by the first movable electrode section 21 and the first fixed electrode section 50.

The second movable electrode section 22 is a portion of the movable body 20 that overlaps the second fixed electrode section 52 in plan view. The second movable electrode section 22 forms capacitance C2 between the second movable electrode section 22 and the second fixed electrode section 52. That is, the capacitance C2 is formed by the second movable electrode section 22 and the second fixed electrode section 52. In the functional device 100, the movable body 20 is formed of a conductive material (silicon doped with impurities), whereby the movable electrode sections 21 and 22 are provided. That is, the first seesaw piece 20a functions as the first movable electrode section 21 and the second seesaw piece 20b functions as the second movable electrode section 22.

The capacitance C1 and the capacitance C2 are set equal to each other, for example, in a state in which the movable body 20 is parallel as shown in FIG. 2. The positions of the movable electrode sections 21 and 22 change according to the movement of the movable body 20. The capacitances C1 and C2 change according to the positions of the movable electrode sections 21 and 22. Predetermined potential is applied to the movable body 20 via the coupling sections 30 and 32 and the supporting section 40.

In the movable body 20, a through-hole 25 piercing through the movable body 20 is formed. Consequently, it is possible to reduce the influence of the air (the resistance of the air) that occurs when the movable body 20 swings. For example, a plurality of the through-holes 25 are formed. In the example shown in the figures, a plane shape of the through-hole 25 is a rectangle.

In the movable body 20, an opening section 26 piercing through the movable body 20 is provided. The opening section 26 is provided on the support axis Q in plan view. In the opening section 26, the coupling sections 30 and 32 and the supporting section 40 are provided. In the example shown in the figures, a plane shape of the opening section 26 is a rectangle. The movable body 20 is connected to the supporting section 40 via the coupling sections 30 and 32.

The coupling sections 30 and 32 couple the movable body 20 and the supporting section 40. The coupling sections 30 and 32 function as a torsion spring. Consequently, the coupling sections 30 and 32 can have a strong restoration force against torsional deformation that occurs in the coupling sections 30 and 32 when the movable body 20 swings in a seesaw manner.

The coupling sections 30 and 32 are arranged on the support axis Q in plan view. The coupling section 30 and 32 extend along the support axis Q. The first coupling section 30 extends in a +Y-axis direction from the supporting section 40. The second coupling section 32 extends in a −Y-axis direction from the supporting section 40.

The supporting section 40 is arranged in the opening section 26. The supporting section 40 is provided on the support axis Q in plan view. A part of the supporting section 40 is joined (connected) to the upper surface 14 of the post section 13. The supporting section 40 supports the movable body 20 via the coupling sections 30 and 32. The supporting section 40 includes a connection region, or a connector, 46 connected to the coupling sections 30 and 32 and provided along the support axis Q and contact regions, or contacts, 63 provided on the outer side of the connection region, or connector, 46 in plan view and electrically connected to the first wire 60 provided on the substrate 10.

The supporting section 40 includes a first portion 41 and second portions 42, 43, 44, and 45 (i.e., first supports 42 and 43 and second supports 44 and 45). The supporting section 40 has a shape in which the first portion 41 extends along a second axis R, which crosses (specifically, is orthogonal to) the support axis Q, and the second portions, or first supports 42, 43 and second supports 44, 45, project from ends of the first portion 41. The second axis R is an axis parallel to the X axis.

The first portion 41 of the supporting section 40 extends while crossing (specifically, being orthogonal to) the support axis Q. The coupling sections 30 and 32 are joined to the first portion 41. The first portion 41 is provided on the support axis Q in plan view and separated from the substrate 10. That is, a portion of the supporting section 40 on the support axis Q is separated from the substrate 10. In the example shown in FIG. 1, a plane shape of the first portion 41 is a rectangle. The first portion 41 extends along the second axis R.

The connection region, or connector, 46 is provided in the first portion 41 of the supporting section 40. In the example shown in FIG. 1, the connection region, or connector, 46 is a region between the first coupling sections 30 and 32 of the supporting section 40 in plan view. In the example shown in the figure, a plane shape of the connection region, or connector, 46 is a rectangle. At least a part of the connection region, or connector, 46 is not fixed to the substrate 10.

The second portions, or first supports 42, 43 and second supports 44, 45, of the supporting section 40 project (extend) from the ends of the first portion 41. In the example shown in FIG. 1, a plane shape of the second portions, or first supports 42, 43 and second supports 44, 45, is a rectangle. The contact regions, or contacts, 63 are respectively provided in the second portions, or first supports 42, 43 and second supports 44, 45.

The second portions, or first supports 42 and 43 of the supporting section 40 extend in opposite directions from each other along an axis parallel to and laterally offset from the support axis Q from one end (specifically, an end in a −X-axis direction) of the first portion 41. In the example shown in the figure, the second portion, or first support, 42 extends in the +Y-axis direction from one end of the first portion 41. The second portion, or first support, 43 extends in the −Y-axis direction from one end of the first portion 41. A part of the second portion, or first support, 42 and a part of the second portion, or first support, 43 are joined to the post section 13.

The second portions, or second supports, 44 and 45 of the supporting section 40 extend in opposite directions from each other along an axis parallel to and laterally offset from the support axis Q from the other end (specifically, an end in a +X-axis direction) of the first portion 41. In the example shown in the figure, the second portion, or second support, 44 extends in the +Y-axis direction from the other end of the first portion 41. The second portion, or second support, 45 extends in the −Y-axis direction from the other end of the first portion 41. A part of the second portion, or second support, 44 and a part of the second portion, or second support, 45 are joined to the post section 13.

The supporting section 40 includes the portions 41, 42, 43, and 44 explained above. Therefore, the supporting section 40 has a plane shape of an H shape (a substantially H shape). That is, the first portion 41 forms an H-shaped horizontal bar. The second portions, or first supports 42, 43 and second supports 44, 45 form an H-shaped vertical bar.

The movable body 20, the coupling sections 30 and 32, and the supporting section 40 are integrally provided. In the example shown in the figure, the movable body 20, the coupling sections 30 and 32, and the supporting section 40 form one structure (silicon structure) 2. The movable body 20, the coupling sections 30 and 32, and the supporting section 40 are integrally provided by patterning one substrate (silicon substrate). The material of the movable body 20, the coupling sections 30 and 32, and the supporting section 40 is silicon imparted with electric conductivity by being doped with impurities such as phosphorus or boron. When the material of the substrate 10 is glass and the material of the movable body 20, the coupling sections 30 and 32, and the supporting section 40 is silicon, the substrate 10 and the supporting section 40 are joined by, for example, anodic bonding.

In the functional device 100, the structure 2 is fixed to the substrate 10 by one supporting section 40. That is, the structure 2 is fixed to the substrate 10 at one point (by the one supporting section 40). Therefore, for example, compared with a form in which the structure is fixed to the substrate at two points (by two supporting sections), it is possible to reduce the influence on the coupling sections 30 and 32 of, for example, stress that occurs because of a difference between a coefficient of thermal expansion of the substrate 10 and a coefficient of thermal expansion of the structure 2 and stress applied to an apparatus during mounting.

The fixed electrode sections 50 and 52 are provided on the substrate 10. In the example shown in the figure, the fixed electrode sections 50 and 52 are provided on the bottom surface 12 of the recess 11. The first fixed electrode section 50 is arranged to be opposed to the first movable electrode section 21. The first movable electrode section 21 is located above the first fixed electrode section 50 via a gap. The second fixed electrode section 52 is arranged to be opposed to the second movable electrode section 22. The second movable electrode section 22 is located above the second fixed electrode section 52 via a gap. The area of the first fixed electrode section 50 and the area of the second fixed electrode section 52 are, for example, equal. A plane shape of the first fixed electrode section 50 and a plane shape of the second fixed electrode section 52 are, for example, symmetrical with respect to the support axis Q.

The material of the fixed electrode sections 50 and 52 is, for example, aluminum, gold, or ITO (Indium Tin Oxide). The material of the fixed electrode sections 50 and 52 is desirably a transparent electrode material such as ITO. This is because, by using the transparent electrode material as the fixed electrode sections 50 and 52, when the substrate 10 is a transparent substrate (a glass substrate), it is possible to easily visually recognize foreign matters or the like present on the fixed electrode sections 50 and 52.

The first wire 60 is provided on the substrate 10. The first wire 60 includes a wiring layer section 61 and bump sections 62.

The wiring layer section 61 of the first wire 60 connects the first pad 70 and the bump sections 62. In the example shown in the figure, the wiring layer section 61 extends from the first pad 70 to the bump sections 62 through a first groove section 17, the recess 11, and the hollow section 15 formed in the substrate 10. A portion of the wiring layer section 61 provided in the hollow section 15 overlaps the supporting section 40 in plan view. In the example shown in the figure, a plane shape of the portion of the wiring layer section 61 provided in the hollow section 15 is an H shape (a substantially H shape). The material of the wiring layer section 61 is, for example, the same as the material of the fixed electrode sections 50 and 52.

The bump sections 62 of the first wire 60 are provided on the wiring layer section 61. The bump sections 62 connect the wiring layer section 61 and the supporting section 40 in the contact regions, or contacts, 63. That is, the contact regions, or contacts, 63 are regions to which the first wire 60 and the supporting section 40 are connected (in contact). More specifically, the contact regions, or contacts, 63 are regions (contact surfaces) of the bump sections 62 that are in contact with the supporting section 40. The material of the bump sections 62 is, for example, aluminum, gold, or platinum.

The contact regions, or contacts, 63 are arranged to avoid the support axis Q. That is, the contact regions, or contacts, 63 are arranged to be separated from the support axis Q. At least one contact region, or contact, 63 is provided on each of one side (specifically, the +X-axis direction side) and the other side (specifically, the −X-axis direction side) across the support axis Q in plan view. The contact regions, or contacts, 63 are provided on both sides of the connection region, or connector, 46 across the support axis Q in plan view. In the example shown in the figure, four contact regions, or contacts, 63 are provided. The contact regions, or contacts, 63 are provided to overlap the second portions, or first supports 42, 43 and second supports 44, 45, of the supporting section 40 in plan view. That is, the contact regions, or contacts, 63 are provided to overlap respective ends of the vertical bar of the supporting section 40 having the H shape (the substantially H shape) in plan view. In the example shown in the figure, a plane shape of the contact regions, or contacts, 63 is a rectangle.

As shown in FIGS. 3 and 4, the contact regions, or contacts, 63 are located above the upper surface 14 of the post section 13 (a joining surface of the post section 13 and the supporting section 40). Specifically, when a silicon substrate is joined to the substrate 10 (details are explained below), the silicon substrate is pushed by the bump sections 62 of the first wire 60 to be hollow. The contact regions, or contacts, 63 are located above the upper surface 14 of the post section 13. For example, the supporting section 40 (the silicon substrate) is pushed by the bump sections 62, whereby stress occurs in the supporting section 40.

Although not shown in the figure, as long as the first wire 60 and the supporting section 40 are set in contact with each other, it is also possible that the supporting section 40 is not hollow and the contact regions, or contacts, 63 and the upper surface 14 of the post section 13 are present in the same position in the Z-axis direction. That is, the contact regions, or contacts, 63 and the upper surface 14 may have the same height. In such a form, as in the form explained above, the first wire 60 and the supporting section 40 come into contact, whereby stress occurs in the supporting section 40.

The second wire 64 is provided on the substrate 10. The second wire 64 connects the second pad 72 and the first fixed electrode section 50. In the example shown in the figure, the second wire 64 extends from the second pad 72 to the first fixed electrode section 50 through a second groove section 18 and the recess 11. The material of the second wire 64 is, for example, the same as the material of the fixed electrode sections 50 and 52.

The third wire 66 is provided on the substrate 10. The third wire 66 connects the third pad 74 and the second fixed electrode section 52. In the example shown in the figure, the third wire 66 extends from the third pad 74 to the second fixed electrode section 52 through a third groove section 19 and the recess 11. The material of the third wire 66 is, for example, the same as the material of the fixed electrode sections 50 and 52.

The pads 70, 72, and 74 are provided on the substrate 10. In the example shown in the figure, the pads 70, 72, and 74 are respectively provided in the groove sections 17, 18, and 19 and connected to the wires 60, 64, and 66. The pads 70, 72, and 74 are provided in positions not overlapping the lid body 80 in plan view. Consequently, even in a state in which the movable body 20 is housed in the substrate 10 and the lid body 80, the capacitances C1 and C2 can be detected by the pads 70, 72, and 74. The material of the pads 70, 72, and 74 is, for example, the same as the material of the fixed electrode sections 50 and 52.

The lid body 80 is provided on the substrate 10. The lid body 80 is joined to the substrate 10. The lid body 80 and the substrate 10 form a cavity 82 in which the movable body 20 is housed. The cavity 82 is, for example, an inert gas (e.g., nitrogen gas) atmosphere. The material of the lid body 80 is, for example, silicon. When the material of the lid body 80 is silicon and the material of the substrate 10 is glass, the substrate 10 and the lid body 80 are joined by, for example, anodic bonding.

The operation of the functional device 100 is explained.

In the functional device 100, the movable body 20 swings about the support axis Q according to physical quantities such as acceleration and an angular velocity. According to the movement of the movable body 20, the distance between the first movable electrode section 21 and the first fixed electrode section 50 and the distance between the second movable electrode section 22 and the second fixed electrode section 52 change. Specifically, for example, when acceleration in the vertical upward direction (the +z-axis direction) is applied to the functional device 100, the movable body 20 rotates counterclockwise. The distance between the first movable electrode section 21 and the first fixed electrode section 50 decreases and the distance between the second movable electrode section 22 and the second fixed electrode section 52 increases. As a result, the capacitance C1 increases and the capacitance C2 decreases. For example, when acceleration in the vertical downward direction (a −Z-axis direction) is applied to the functional device 100, the movable body 20 rotates clockwise. The distance between the first movable electrode section 21 and the first fixed electrode section 50 increases and the distance between the second movable electrode section 22 and the second fixed electrode section 52 decreases. As a result, the capacitance C1 decreases and the capacitance C2 increases.

In the functional device 100, the capacitance C1 is detected using the pads 70 and 72 and the capacitance C2 is detected using the pads 70 and 74. It is possible to detect physical quantities such as directions and magnitudes of acceleration, an angular velocity, and the like, based on the difference between the capacitance C1 and the capacitance C2 (by a so-called differential detection).

As explained above, the functional device 100 can be used as inertial sensors such as an acceleration sensor and a gyro sensor. Specifically, the functional device 100 can be used as, for example, a capacitance-type acceleration sensor for measuring acceleration in the vertical direction (the Z-axis direction).

The functional device 100 has, for example, characteristics explained below.

In the functional device 100, the supporting section 40 includes the connection region, or connector, 46 connected to the coupling sections 30 and 32 and provided along the support axis Q and the contact regions, or contacts, 63 provided on the outer side of the connection region, or connector, 46 in plan view and electrically connected to the first wire 60 provided on the substrate 10. That is, in the functional device 100, the contact regions, or contacts, 63 connected to the first wire 60 and the supporting section 40 are arranged to avoid the support axis Q. Therefore, in the functional device 100, compared with a form in which the contact region is arranged on the support axis in plan view, it is possible to increase the distance between the contact regions, or contacts, 63 and the support axis Q. Therefore, in the functional device 100, it is possible to reduce the influence on the coupling sections 30 and 32 of stress that occurs when the supporting section 40 is pushed by the first wire 60. For example, it is possible to prevent the stress that occurs in the supporting section 40 from being transmitted to the coupling sections 30 and 32. As a result, the functional device 100 can have high detection sensitivity.

In the functional device 100, at least a part of the connection region, or connector, 46 is not fixed to the substrate 10. That is, in the functional device 100, a portion on the support axis Q of the supporting section 40 in plan view is separated from the substrate 10. For example, when the supporting section 40 made of silicon and the substrate 10 made of glass are joined, in some case, stress occurs because of a difference between a coefficient of thermal expansion of the supporting section 40 and a coefficient of thermal expansion of the substrate 10 and affects the coupling sections 30 and 32. In the functional device 100, the portion (the connection region, or connector, 46) on the support axis Q of the supporting section 40 is separated from the substrate 10. Therefore, it is possible to reduce the influence on the coupling sections 30 and 32 of the stress that occurs because of the difference between the coefficient of thermal expansion of the supporting section 40 and the coefficient of thermal expansion of the substrate 10.

In the functional device 100, the opening 26 is provided in the movable body 20 and the supporting section 40 is arranged in the opening section 26. Consequently, in the functional device 100, the structure 2 including the movable body 20, the coupling sections 30 and 32, and the supporting section 40 can be easily fixed to the substrate 10 by the one supporting section 40. That is, the structure 2 is fixed to the substrate 10 at one point (by the one supporting section 40). Therefore, for example, compared with a form in which the structure is fixed to the substrate at two points (by two supporting sections), it is possible to reduce the influence on the coupling sections 30 and 32 of, for example, stress that occurs because of a difference between a coefficient of thermal expansion of the substrate 10 and a coefficient of thermal expansion of the structure 2 and stress applied to an apparatus during mounting.

In the functional device 100, the contact regions, or contacts, 63 are provided on one side and the other side across the support axis Q (on both sides of the connection region, or connector, 46 across the support axis Q) in plan view. Consequently, it is possible to more surely apply potential to the movable body 20 via the coupling sections 30 and 32 and the supporting section 40.

In the functional device 100, the supporting section 40 has a shape in which the first portion 41 extends along the second axis R, which crosses the support axis Q, and the second portions, or first supports 42, 43 and second supports 44, 45, project from the ends of the first portion 41. The connection region, or connector, 46 is provided in the first portion 41. The contact regions, or contacts, 63 are provided in the second portions, or first supports 42, 43 and second supports 44, 45. Specifically, the first portion 41 of the supporting section 40 extends to both sides along the second axis R across the support axis Q. The second portions, or first supports 42, 43 and second supports 44, 45, project from both ends of the first portion 41. The contact regions, or contacts, 63 are respectively provided in the second portions, or first supports 42, 43 and second supports 44, 45. Therefore, in the functional device 100, compared with a form in which the contact regions overlap the first portion, it is possible to increase the distance between the contact regions, or contacts, 63 and the support axis Q. Therefore, it is possible to more surely reduce the influence on the coupling sections 30 and 32 of the stress that occurs when the supporting section 40 is pushed by the first wire 60.

Further, in the functional device 100, the supporting section 40 includes the second portions, or first supports 42 and second support 44. Therefore, it is possible to reduce the size of a gap (a gap in the X-axis direction) between the first coupling section 30 and the supporting section 40. Similarly, the supporting section 40 includes the second portions, or first support 43 and second support 45. Therefore, it is possible to reduce the size of a gap (a gap in the X-axis direction) between the second coupling section 32 and the supporting section 40. Consequently, for example, when a silicon substrate is etched to form the coupling sections 30 and 32, it is possible to suppress etching speed from fluctuating because of a micro loading effect. Therefore, in the functional device 100, it is possible to form the coupling sections 30 and 31 at high accuracy.

In the functional device 100, at least a part of the supporting section 40 is connected to the post section 13 provided in the substrate 10. Consequently, it is possible to firmly fix the supporting section 40 above the substrate 10.

1.2. Manufacturing Method for the Functional Device

Figure 5:
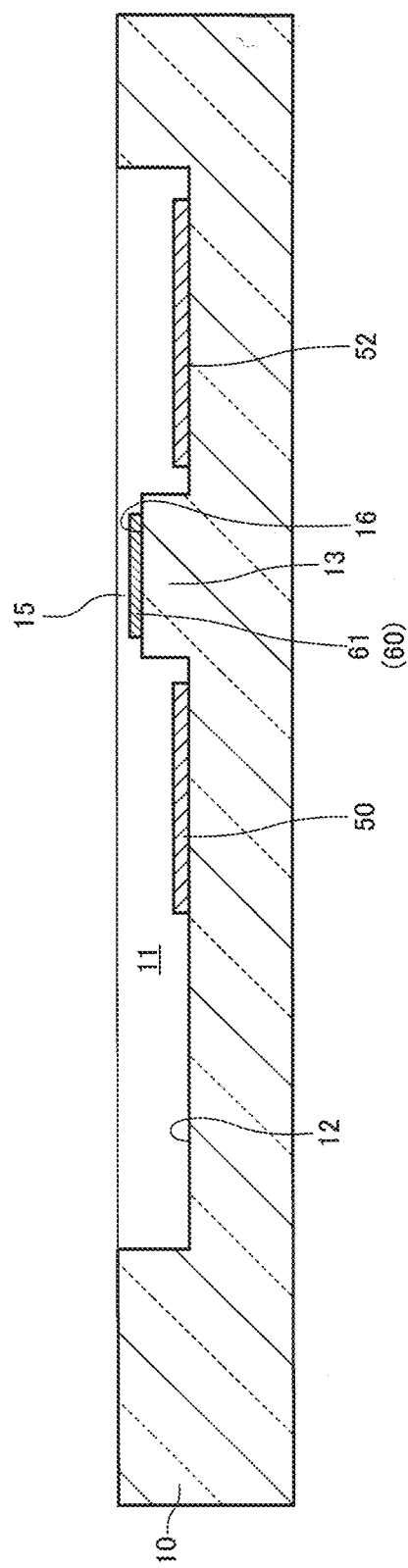
FIG. 5 is a sectional view schematically showing a manufacturing process for the physical quantity sensor according to the first embodiment.
Figure 6:
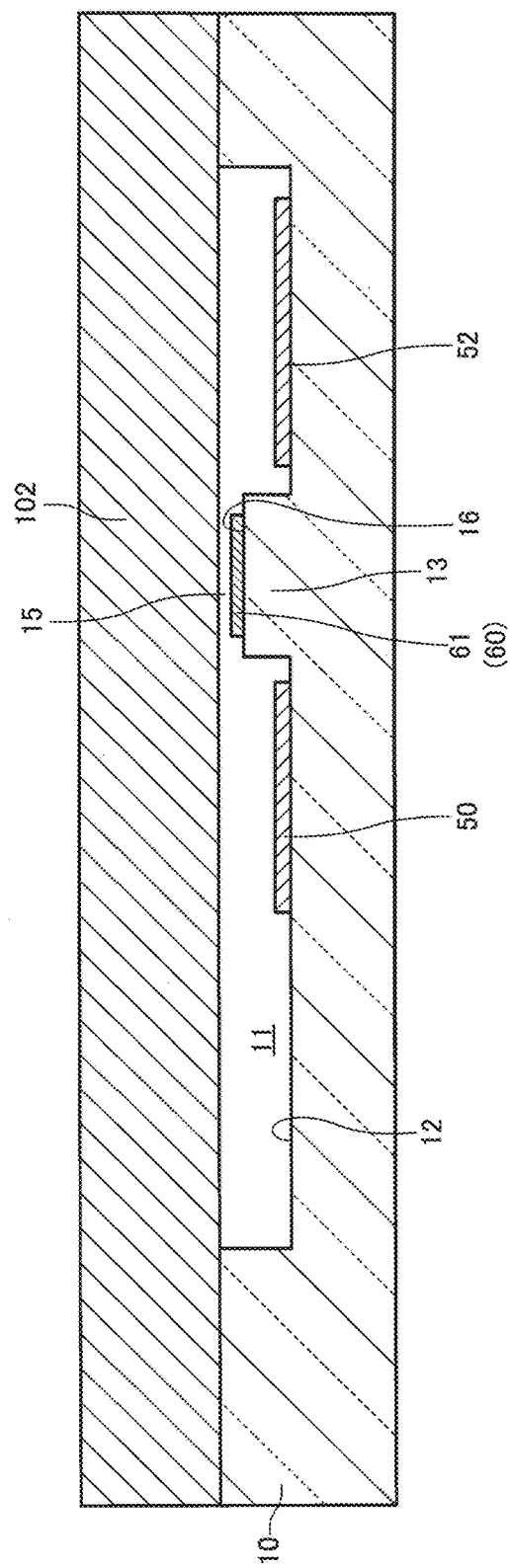
FIG. 6 is a sectional view schematically showing the manufacturing process for the physical quantity sensor according to the first embodiment.
Figure 7:
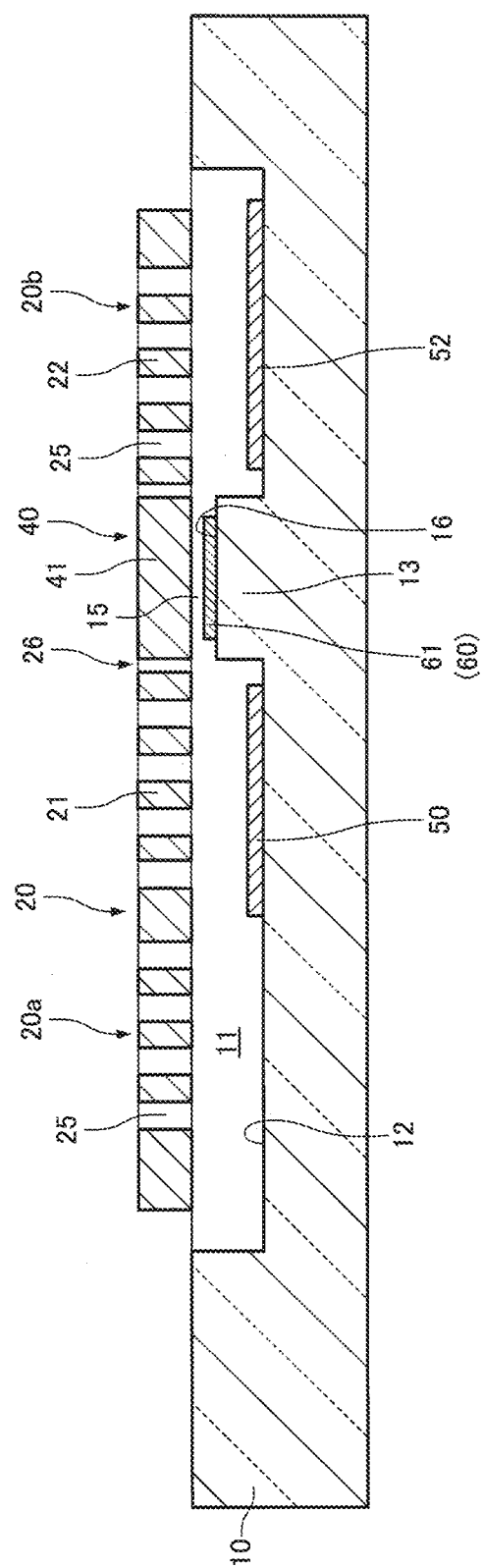
FIG. 7 is a sectional view schematically showing the manufacturing process for the physical quantity sensor according to the first embodiment.

A manufacturing method for the functional device according to the first embodiment is explained with reference to the drawings. FIGS. 5 to 7 are sectional views schematically showing a manufacturing process for the functional device 100 according to the first embodiment and correspond to FIG. 2.

As shown in FIG. 5, for example, a glass substrate is patterned to form the recess 11, the post section 13 on which the hollow section 15 is formed, and the groove sections 17, 18, and 19 (see FIG. 1). The patterning is performed by, for example, photolithography and etching. The substrate 10 on which the recess 11, the post section 13, and the groove sections 17, 18, and 19 are formed can be obtained by this process.

Subsequently, the fixed electrode sections 50 and 52 are formed on the bottom surface 12 of the recess 11. The wiring layer section 61 and the wires 64 and 66 are formed on the substrate 10 (see FIG. 1). The wires 64 and 66 are formed to be respectively connected to the fixed electrode sections 50 and 52. The bump sections 62 are formed on the wiring layer section 61 (see FIGS. 3 and 4). Consequently, the first wire 60 can be formed. The bump sections 62 are formed such that the upper surfaces of the bump sections 62 are located above the upper surface 14 of the post section 13. The pads 70, 72, and 74 are formed to be respectively connected to the wires 60, 64, and 66 (see FIG. 1).

The fixed electrode sections 50 and 52, the wires 60, 64, and 66, and the pads 70, 72, and 74 are formed by, for example, film formation by a sputtering method or a CVD (Chemical Vapor Deposition) method and patterning. The patterning is performed by, for example, photolithography and etching.

As shown in FIG. 6, for example, a silicon substrate 102 is joined to the substrate 10. The joining of the substrate 10 and the silicon substrate 102 is performed by, for example, anodic bonding. Consequently, it is possible to firmly join the substrate 10 and the silicon substrate 102. When the silicon substrate 102 is joined to the substrate 10, for example, the silicon substrate 102 is pushed by the bump sections 62 of the first wire 60 to be hollowed (see FIGS. 3 and 4). Consequently, stress occurs in the silicon substrate 102.

As shown in FIG. 7, the silicon substrate 102 is ground by, for example, a grinding machine to be thinned and thereafter patterned into a predetermined shape to integrally form the movable body 20, the coupling sections 30 and 32, and the supporting section 40. The patterning is performed by photolithography and etching (dry etching). AS a more specific etching technique, a Bosch method can be used.

As shown in FIG. 2, the lid body 80 is joined to the substrate 10. The movable body 20 and the like are housed in the cavity 82 formed by the substrate 10 and the lid body 80. The joining of the substrate 10 and the lid body 80 is performed by, for example, anodic bonding. Consequently, it is possible to firmly join the substrate 10 and the lid body 80. By performing this process in an inert gas atmosphere, it is possible to fill an inert gas in the cavity 82.

The functional device 100 can be manufactured by the process explained above.

1.3. Modifications of the Functional Device 1.3.1. First Modification

Figure 8:
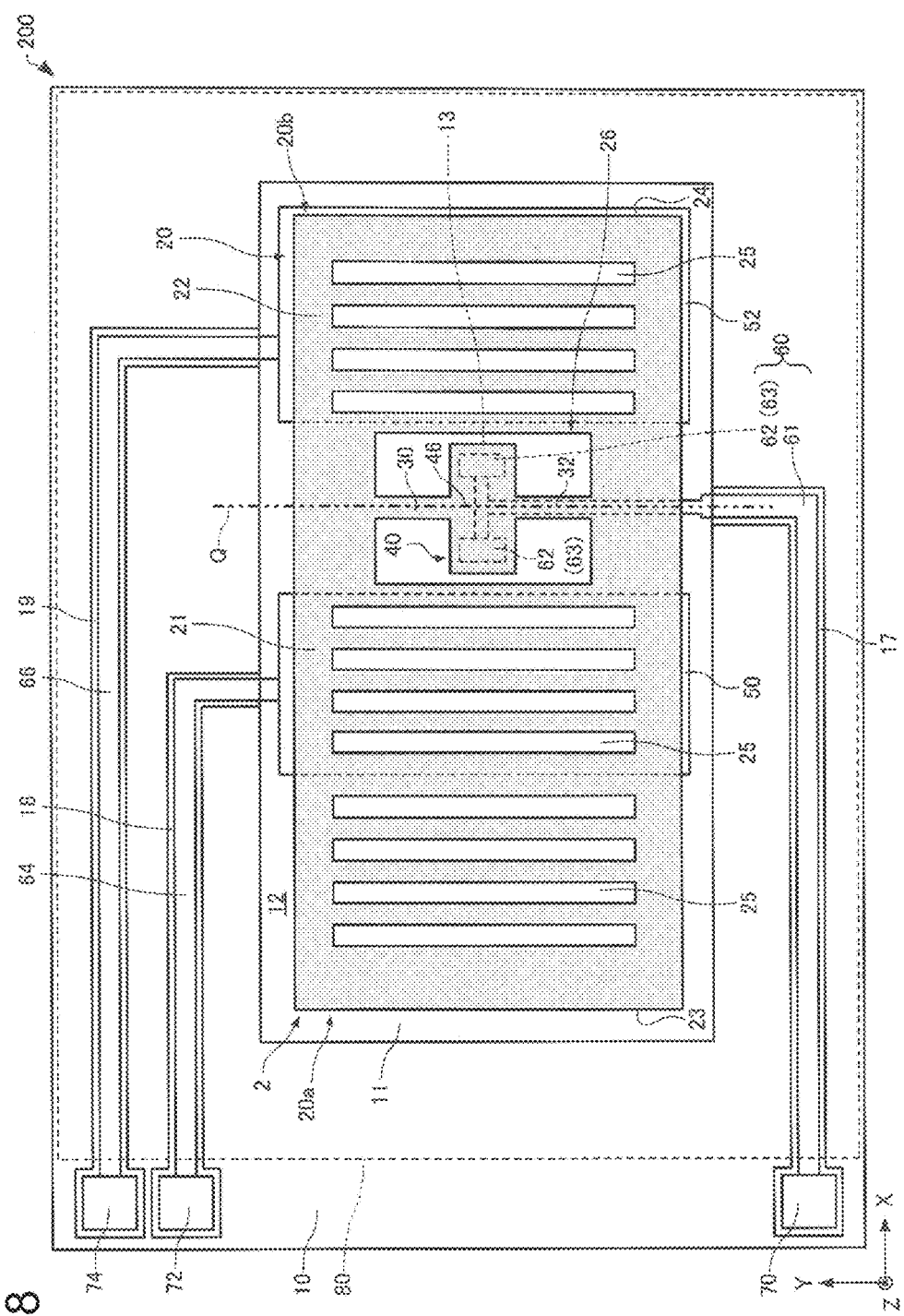
FIG. 8 is a plan view schematically showing a physical quantity sensor according to a first modification of the first embodiment.

A functional device according to a first modification of the first embodiment is explained with reference to the drawings. FIG. 8 is a plan view schematically showing a functional device 200 according to the first modification of the first embodiment. For convenience, in FIG. 8, the lid body 80 is seen through. In FIG. 8 and FIGS. 9 to 12 referred to below, as three axes orthogonal to one another, the X axis, the Y axis, and the Z axis are shown.

In the following explanation, in the functional device 200 according to the first modification of the first embodiment, members having functions same as the functions of the members of the functional device 100 according to the first embodiment are denoted by the same reference numerals and signs and detailed explanation of the members is omitted. The same applies to a functional device according to a second modification of the first embodiment explained below.

In the functional device 100, as shown in FIG. 1, the plane shape of the supporting section 40 is the H shape (the substantially H shape). On the other hand, in the functional device 200, as shown in FIG. 8, the plane shape of the supporting section 40 is a quadrangle (in an example shown in the figure, a rectangle).

In the functional device 200, one contact region, or contacts, 63 is provided on each of one side (specifically, the +X-axis direction side) and the other side (specifically, the −X-axis direction side) across the support axis Q in plan view.

Like the functional device 100, the functional device 200 can have high detection sensitivity.

1.3.2. Second Modification

Figure 9:
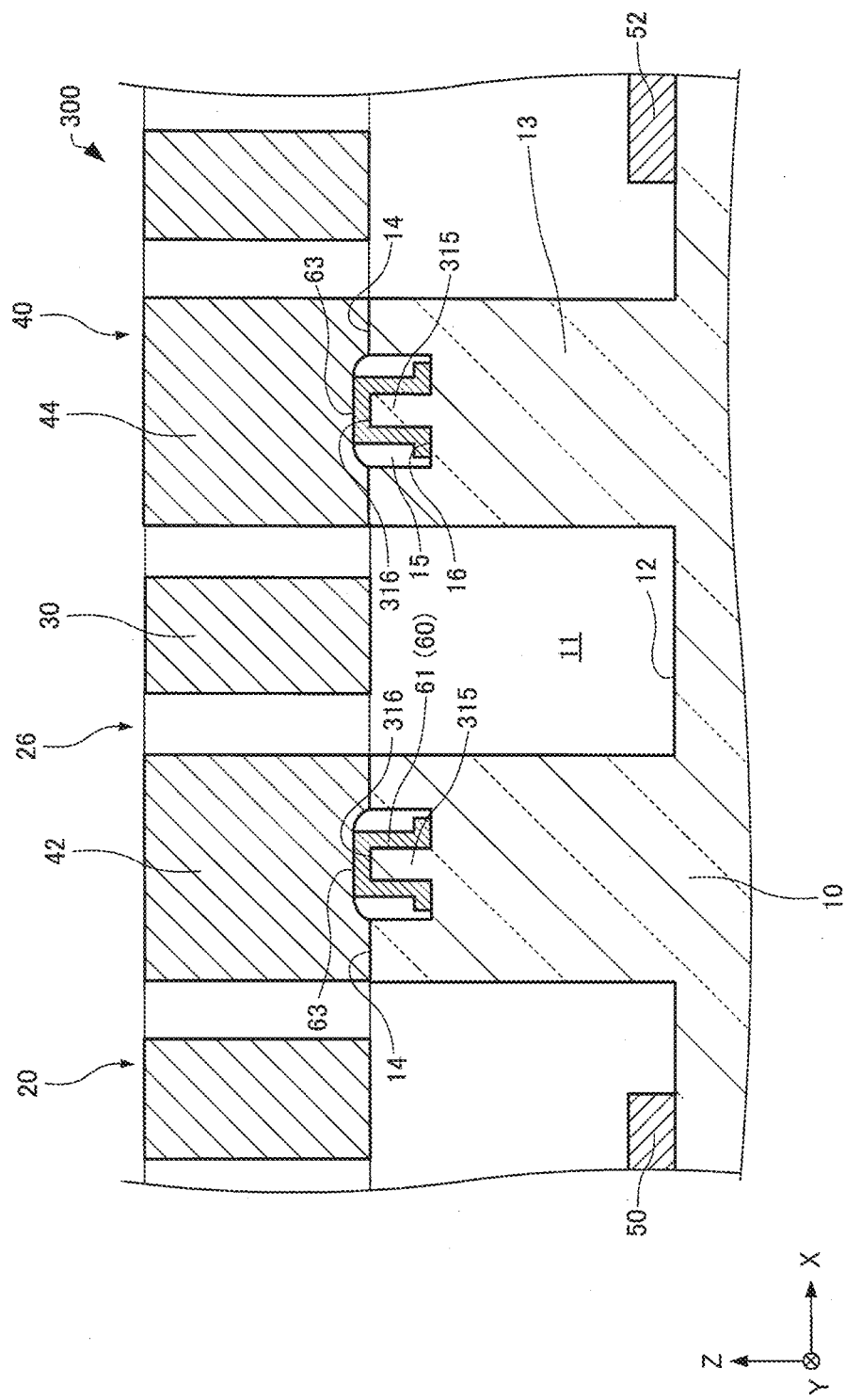
FIG. 9 is a sectional view schematically showing a physical quantity sensor according to a second modification of the first embodiment.
Figure 10:
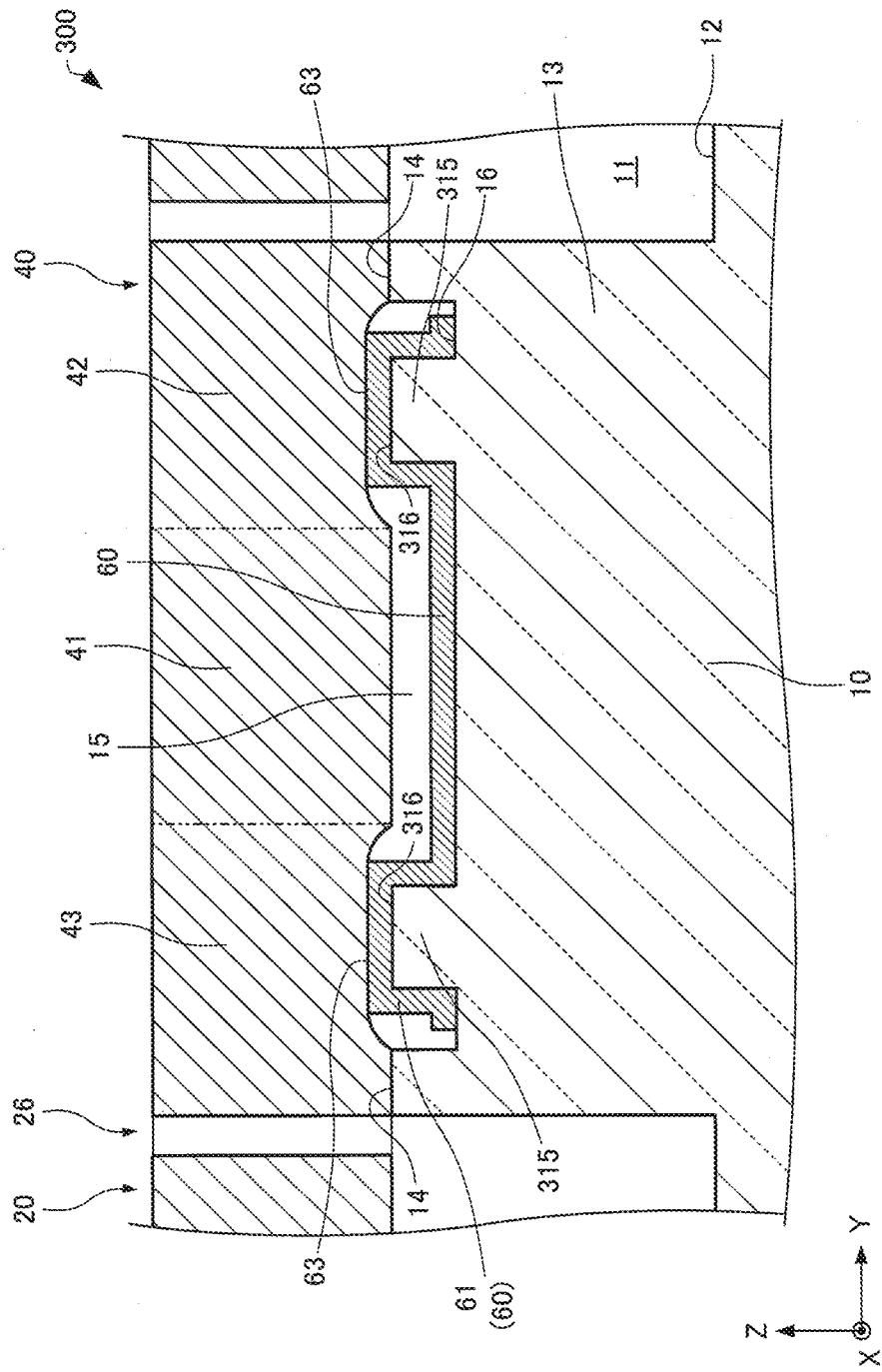
FIG. 10 is a sectional view schematically showing the physical quantity sensor according to the second modification of the first embodiment.

A functional device according to a second modification of the first embodiment is explained with reference to the drawings. FIG. 9 is a sectional view schematically showing a functional device 300 according to the second modification of the first embodiment and corresponds to FIG. 3. FIG. 10 is a sectional view schematically showing the functional device 300 according to the second modification of the first embodiment and corresponds to FIG. 4. For convenience, in FIGS. 7 and 8, the lid body 80 is not shown.

In the functional device 100, as shown in FIGS. 3 and 4, the first wire 60 includes the wiring layer section 61 and the bump sections 62. The contact surfaces of the bump sections 62 and the supporting section 40 are the contact regions 63. On the other hand, in the functional device 300, as shown in FIGS. 9 and 10, the first wire 60 does not include the bump sections 62. Contact surfaces of the wiring layer section 61 and the supporting section 40 are the contact regions 63.

In the functional device 300, protrusion sections 315 are provided on the bottom surface 16 of the hollow section 15. In an example shown in the figure, the protrusion sections 315 are provided integrally with the post section 13. The protrusion sections 315 project upward from the bottom surface 16. In the example shown in the figure, upper surfaces 316 of the protrusion sections 315 and the upper surface 14 of the post section 13 are present in the same position in the Z-axis direction. That is, the upper surfaces 316 of the protrusion sections 315 and the upper surface 14 of the post section 13 have the same height.

In the functional device 300, a part of the first wire 60 is provided on the protrusion sections 315. That is, the first wire 60 is provided on the bottom surface (an inner bottom) 16 of the hollow section 15. The contact regions, or contacts, 63 connected to the first wire 60 and the supporting section 40 are arranged to overlap the protrusion sections 315 in plan view. That is, the contact regions, or contacts, 63 are arranged above the protrusion sections 315. In other words, the contact regions, or contacts, 63 are provided to overlap the first wire 60 provided in the hollow section 15 in plan view.

Although not shown in the figure, as long as the first wire 60 and the supporting section 40 are set in contact with each other, the upper surfaces 316 of the protrusion sections 315 may be located above (in the +Z-axis direction) the upper surface 14 of the post section 13 or may be located below (in the −Z-axis direction) the upper surface 14 of the post section 13.

In the functional device 300, the first wire 60 is provided on the protrusion sections 315. Therefore, unlike the functional device 100, even if the bump sections 62 are not provided (even if the first wire 60 is not formed thick), the first wire 60 and the supporting section 40 can be surely set in contact with each other. For example, in a form in which the wiring layer section is formed thick and the first wire and the supporting section are set in contact with each other, in some case, it is difficult to control the thickness of the wiring layer section and the first wire and the supporting section cannot be surely set in contact with each other. Further, in the functional device 300, since the bump sections 62 are not provided, it is possible to attain simplification of a manufacturing process.

2. Second Embodiment

2.1. Functional Device

Figure 11:
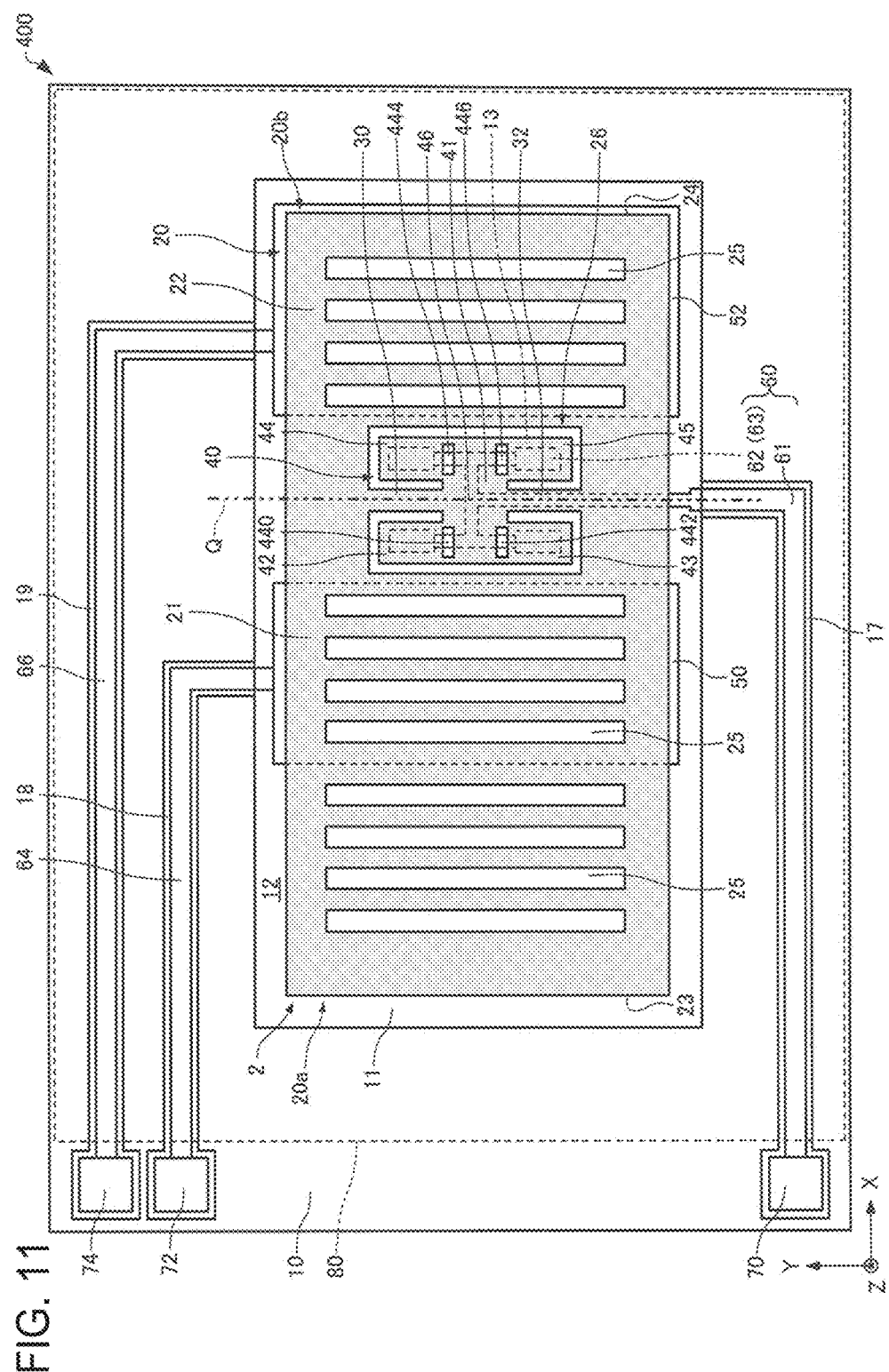
FIG. 11 is a plan view schematically showing a physical quantity sensor according to a second embodiment.

A functional device according to a second embodiment is explained with reference to the drawings. FIG. 11 is a plan view schematically showing a functional device 400 according to the second embodiment. For convenience, in FIG. 11, the lid body 80 is seen through.

In the following explanation, in the functional device 400 according to the second embodiment, members having functions same as the functions of the members of the functional device 100 according to the first embodiment are denoted by the same reference numerals and signs and detailed explanation of the members is omitted.

The functional device 400 is different form the functional device 100 in that, as shown in FIG. 11, first to fourth slits (first stress buffering sections) 440, 442, 444, and 446 are formed in the supporting section 40. In an example shown in the figure, a plane shape of the slits 440, 442, 444, and 446 is a rectangle. The slits 440, 442, 444, and 446 can piece through the supporting section 40 or do not have to pierce through the supporting section 40.

When stress that occurs when the supporting section 40 is pushed by the first wire 60 is transmitted, for example, from the contact regions, or contacts, 63 to the coupling sections, the slits 440, 442, 444, and 446 are formed in a path of the stress. In the supporting section 40, the slits 440, 442, 444, and 446 are provided between the connection region, or connector, 46 and the contact regions, or contacts, 63.

Specifically, the first slit 440 is formed near a boundary between the first portion 41 and the second portion, or first support, 42. The first slit 440 may be formed on a boundary line between the first portion 41 and the second portion, or first support, 42 (to overlap the boundary line in plan view).

The second slit 442 is formed near a boundary between the first portion 41 and the second portion, or first support, 43. The second slit 442 may be formed on a boundary line between the first portion 41 and the second portion, or first support, 43 (to overlap the boundary line in plan view).

The third slit 444 is formed near a boundary between the first portion 41 and the second portion, or second support, 44. The third slit 444 may be formed on a boundary line between the first portion 41 and the second portion, or second support, 44 (to overlap the boundary line in plan view).

The fourth slit 446 is formed near a boundary between the first portion 41 and the second portion, or second support, 45. The fourth slit 446 may be formed on a boundary line between the first portion 41 and the second portion, or second support, 45 (to overlap the boundary line in plan view).

In the functional device 400, it is possible to more surely reduce, with the slits 440, 442, 444, and 446, the influence on the coupling sections 30 and 32 of stress that occurs when the supporting section 40 is pushed by the first wire 60.

2.2. Manufacturing Method for the Functional Device

A manufacturing method for the functional device according to the second embodiment is basically the same as the manufacturing method for the functional device according to the first embodiment except that the slits 440, 442, 444, and 446 are formed when the silicon substrate 102 is patterned. Therefore, explanation of the manufacturing method is omitted.

3. Third Embodiment

3.1. Functional Device

Figure 12:
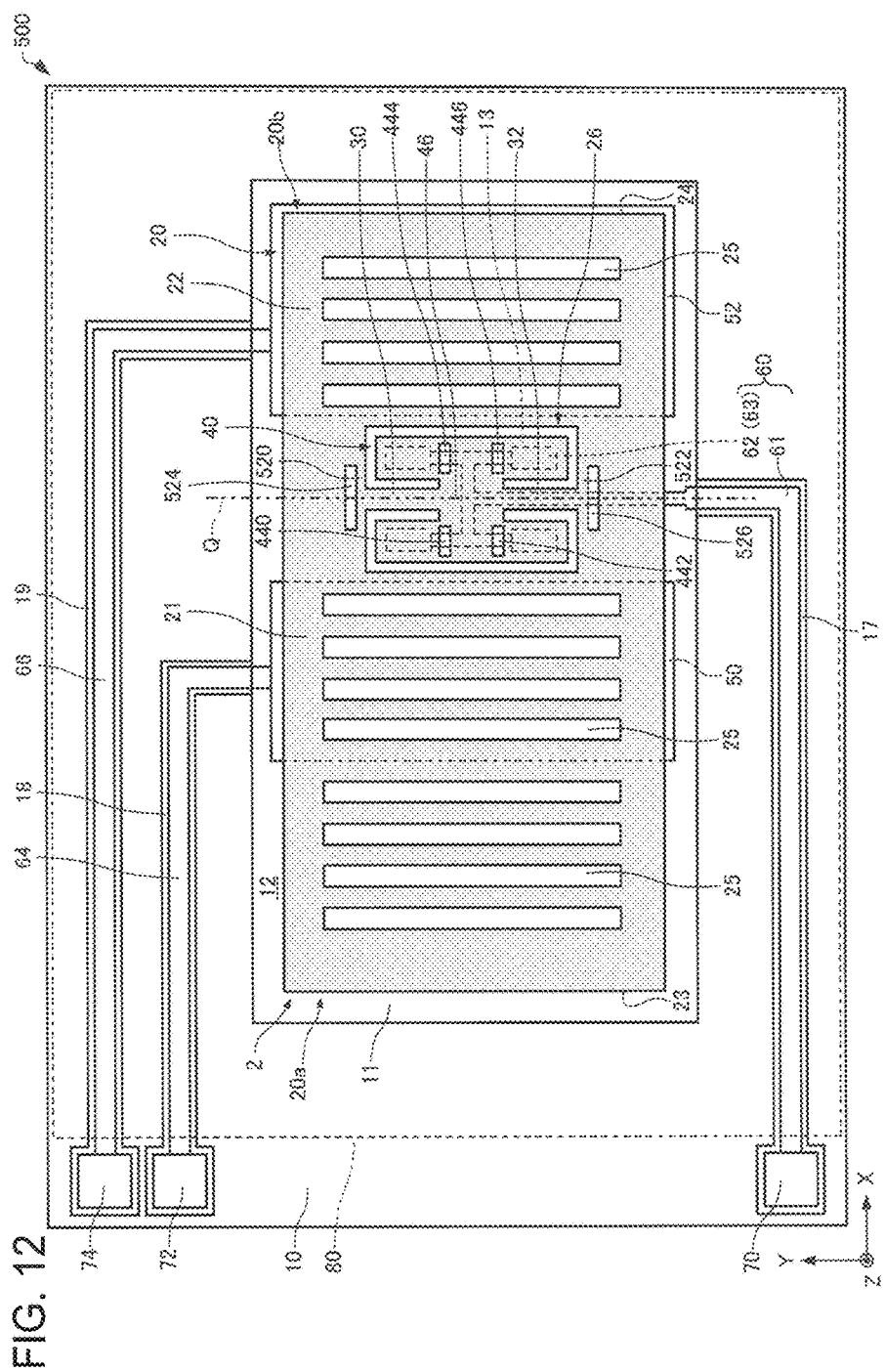
FIG. 12 is a plan view schematically showing a physical quantity sensor according to a third embodiment.

A functional device according to a third embodiment is explained with reference to the drawings. FIG. 12 is a plan view schematically showing a functional device 500 according to the third embodiment. For convenience, in FIG. 12, the lid body 80 is seen through.

In the following explanation, in the functional device 500 according to the third embodiment, members having functions same as the functions of the members of the functional device 100 according to the first embodiment are denoted by the same reference numerals and signs and detailed explanation of the members is omitted.

The functional device 500 is different from the functional device 400 in that, as shown in FIG. 12, the movable body 20 includes first and second spring sections (second stress buffering sections) 520 and 522 connected to the coupling sections 30 and 32. Specifically, in the functional device 500, the spring sections 520 and 522 are provided in portions of the movable body 20 connected to the coupling sections 30 and 32.

In the functional device 500, fifth and sixth slits 524 and 526 are formed in the movable body 20. The slits 524 and 526 are formed on the support axis Q in plan view. In an example shown in the figure, a plane shape of the slits 524 and 526 is a rectangle. The slits 524 and 526 can pierce through the movable section 20 or do not have to pierce through the movable section 20.

The first spring section 520 is a region of the supporting section 40 between the fifth slit 524 and the opening section 26. In the example shown in the figure, a plane shape of the first spring section 520 is a rectangle having long sides along the X axis. The first spring section 520 is connected to the first coupling section 30. The width (the size in the Y-axis direction) of the first spring section 520 is, for example, equal to or smaller than the width (the size in the X-axis direction) of the first coupling section 30.

The second spring section 522 is a region of the supporting section 40 between the sixth slit 526 and the opening section 26. In the example shown in the figure, a plane shape of the second spring section 522 is a rectangle having long sides along the X axis. The second spring section 522 is connected to the second coupling section 32. The width (the size in the Y-axis direction) of the second spring section 522 is, for example, equal to or smaller than the width (the size in the X-axis direction) of the second coupling section 32.

In the functional device 500, it is possible to reduce the influence on the coupling sections 30 and 32 of stress that occurs when the movable body 20 is greatly displaced. For example, in a form in which the movable body does not include the spring sections, when large acceleration is applied to the functional device because of, for example, an impact at the time when the functional device is dropped, stress sometimes occurs in the coupling section because the movable body is greatly displaced. The coupling sections are sometimes damaged by the stress. In the functional device 500, it is possible to reduce, with the spring sections 520 and 522, the influence on the coupling sections 30 and 32 of the stress that occurs when the movable body is greatly displaced. As a result, it is possible to suppress the coupling sections 30 and 32 from being damaged. The functional device 500 can have high reliability.

3.2. Manufacturing Method for the Functional Device

A manufacturing method for the functional device according to the third embodiment is basically the same as the manufacturing method for the functional device according to the first embodiment except that the slits 440, 442, 444, 446, 524, and 526 are formed when the silicon substrate 102 is patterned. Therefore, explanation of the manufacturing method is omitted.

4. Fourth Embodiment

An electronic apparatus according to a fourth embodiment is explained with reference to the drawings. The electronic apparatus according to the fourth embodiment includes the functional device according to the invention. An electronic apparatus including the functional device 100 as the functional device according to the invention is explained below.

Figure 13:
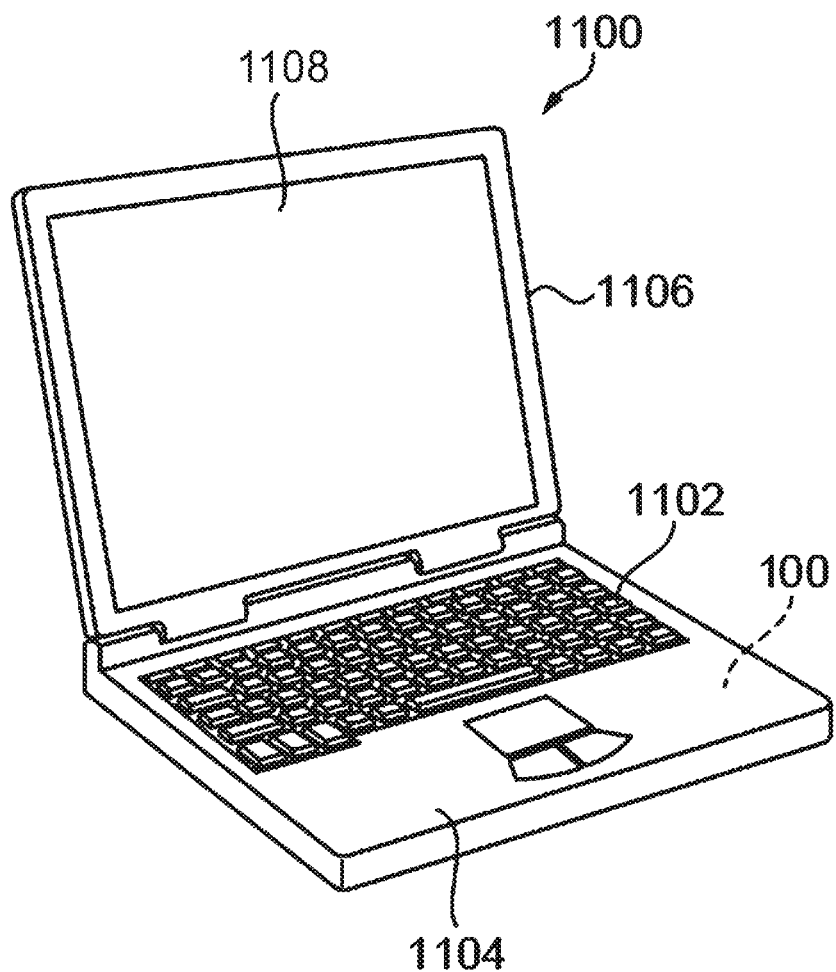
FIG. 13 is a perspective view schematically showing an electronic apparatus according to a fourth embodiment.

FIG. 13 is a perspective view schematically showing a mobile (or notebook) personal computer 1100 as the electronic apparatus according to the fourth embodiment.

As shown in FIG. 13, the personal computer 1100 includes a main body section 1104 including a keyboard 1102 and a display unit 1106 including a display section 1108. The display unit 1106 is pivotably supported on the main body section 1104 via a hinge structure section.

The functional device 100 is incorporated in the personal computer 1100.

Figure 14:
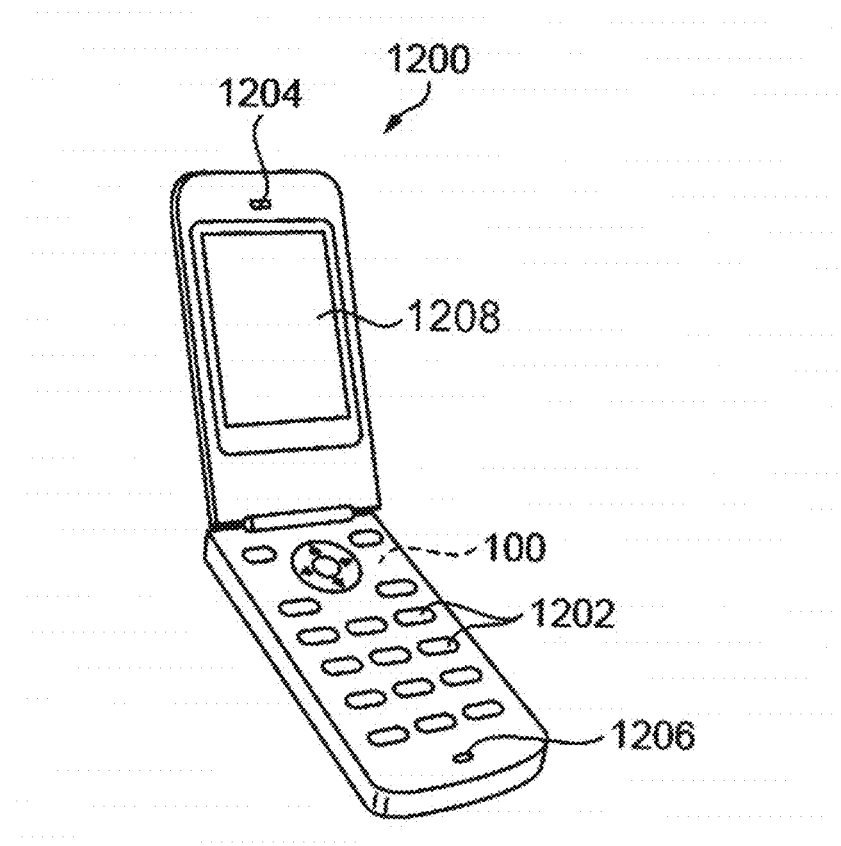
FIG. 14 is a perspective view schematically showing the electronic apparatus according to the fourth embodiment.

FIG. 14 is a perspective view schematically showing a cellular phone (including a PHS) 1200 as the electronic apparatus according to the fourth embodiment.

As shown in FIG. 14, the cellular phone 1200 includes a plurality of operation buttons 1202, an ear piece 1204 and a mouth piece 1206. A display section 1208 is arranged between the operation buttons 1202 and the ear piece 1204.

The functional device 100 is incorporated in the cellular phone 1200.

Figure 15:
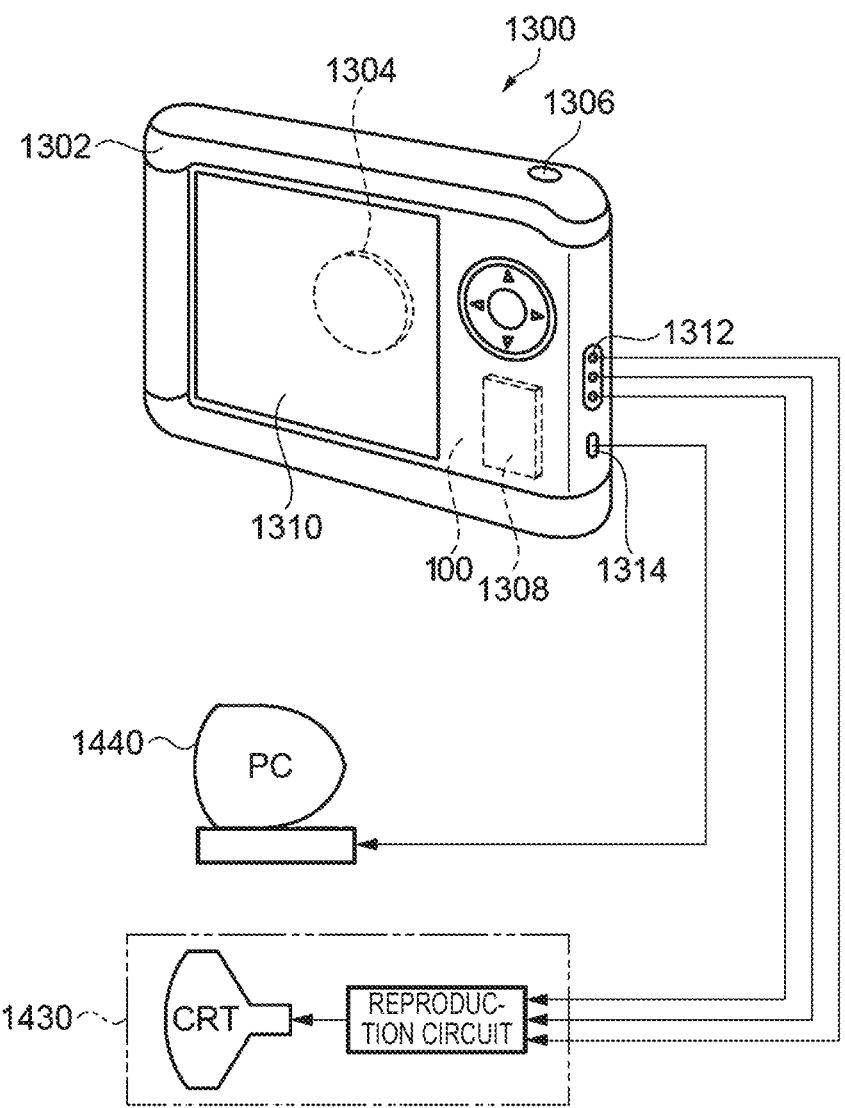
FIG. 15 is a perspective view schematically showing the electronic apparatus according to the fourth embodiment.

FIG. 15 is a perspective view schematically showing a digital still camera 1300 as the electronic apparatus according to the third embodiment. In FIG. 15, connection to an external apparatus is also briefly shown.

Whereas a normal camera exposes a silver salt photograph film with a light image of an object, the digital still camera 1300 photoelectrically converts the light image of the object with an imaging device such as a CCD (Charge Coupled Device) to generate an imaging signal (an image signal).

A display section 1310 is provided on the back of a case (a body) 1302 in the digital still camera 1300 and configured to perform display on the basis of the imaging signal generated by the CCD. The display section 1310 functions as a finder that displays the object as an electronic image.

On the front side (the rear side in the figure) of the case 1302, a light receiving unit 1304 including an optical lens (an imaging optical system) and a CCD is provided.

When a photographer checks an object image displayed on the display section 1310 and depresses a shutter button 1306, an imaging signal of the CCD at that point is transferred to and stored in a memory 1308.

In the digital still camera 1300, a video signal output terminal 1312 and an input/output terminal 1314 for data communication are provided on a side surface of the case 1302. A television monitor 1430 and a personal computer 1440 are respectively connected to the video signal output terminal 1312 and the input/output terminal 1314 for data communication according to necessity. Further, the imaging signal stored in the memory 1308 is output to the television monitor 1430 and the personal computer 1440 by predetermined operation.

The functional device 100 is incorporated in the digital still camera 1300.

Since the electronic apparatuses 1100, 1200, and 1300 include the functional device 100, the electronic apparatuses 1100, 1200, and 1300 can have high detection sensitivity.

Besides the personal computer (the mobile personal computer) shown in FIG. 13, the cellular phone shown in FIG. 14, and the digital still camera shown in FIG. 15, the electronic apparatus including the functional device 100 can also be applied to an inkjet-type discharge apparatus (e.g., an inkjet printer), a laptop personal computer, a television, a video camera, a video tape recorder, various navigation apparatuses, a pager, an electronic notebook (including an electronic notebook with a communication function), an electronic dictionary, an electronic calculator, an electronic game machine, a head mounted display, a word processor, a work station, a video phone, a security television monitor, an electronic binocular, a POS terminal, medical apparatuses (e.g., an electronic thermometer, a sphygmomanometer, a blood sugar meter, an electrocardiogram apparatus, an ultrasonic diagnostic apparatus, and an electronic endoscope), a fish finder, various measuring apparatuses, meters (e.g., meters for a vehicle, an airplane, a rocket, and a ship), posture control for a robot, a human body, and the like, a flight simulator, and the like.

5. Fifth Embodiment

A moving object according to a fifth embodiment is explained with reference to the drawings. The moving object according to the fifth embodiment includes the functional device according to the invention. A moving object including the functional device 100 as the functional device according to the invention is explained below.

Figure 16:
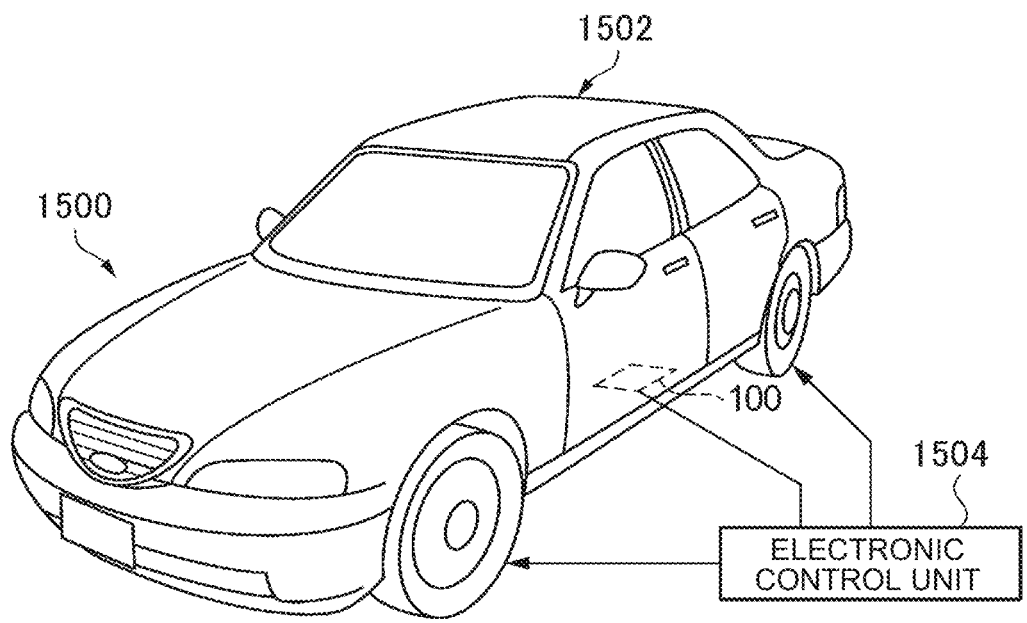
FIG. 16 is a perspective view schematically showing a moving object according to a fifth embodiment.

FIG. 16 is a perspective view schematically showing an automobile 1500 as the moving object according to the fifth embodiment.

The functional device 100 is incorporated in the automobile 1500. Specifically, as shown in FIG. 16, an electronic control unit (ECU) 1504 incorporating the functional device 100, which detects acceleration of the automobile 1500, and configured to control an output of an engine is mounted on a vehicle body 1502 of the automobile 1500. Besides, the functional device 100 can be widely applied to a vehicle body posture control unit, an anti-lock brake system (ABS), an air bag, and a tire pressure monitoring system (TPMS).

Since the automobile 1500 includes the functional device 100, the automobile 1500 can have high detection sensitivity.

The embodiments and the modifications explained above are examples. The invention is not limited to the embodiments and the modifications. For example, the embodiments and the modifications can be combined as appropriate.

The invention includes components substantially the same as the components explained in the embodiments (e.g., components having the same functions, methods, and results or components having the same purposes and effects). The invention includes components in which non-essential portions of the components explained in the embodiments are replaced. The invention includes components that can realize action and effects or attain objects same as those of the components explained in the embodiments. The invention includes components in which publicly-known techniques are added to the components explained in the embodiments.

What is claimed is:

1. A functional device comprising:
    a substrate having a surface;
    a wire provided on the surface of the substrate;
    a movable body supported in a spaced apart relationship relative to the surface of the substrate, the movable body being configured to selectively pivot about a first axis with respect to the surface of the substrate; and
    a supporting section configured to pivotally support the movable body relative to the substrate, the supporting section including:
        a connector connected to the movable body, the connector extending along the first axis; and
        a first support connected to the connector and to the substrate, the first support being disposed alongside the connector and extending along a second axis laterally offset from the first axis, the first support including a first contact electrically connected to the wire, the first contact being electrically connected to the wire along the second axis,
    wherein the supporting section is the only physical connection between the movable body and the substrate.

2. The functional device according to claim 1, wherein the connector is not fixed to the substrate along the first axis.

3. The functional device according to claim 1, wherein an opening is provided in the movable body, and the supporting section is arranged in the opening.

4. The functional device according to claim 1, wherein the supporting section further includes a second support connected to the connector and to the substrate, the second support being disposed alongside the connector and extending along a third axis laterally offset from the first axis, the second support including a second contact electrically connected to the wire, the second contact being electrically connected to the wire along the third axis, and
    the first and second contacts being on opposite sides of the first axis in a plan view.

5. The functional device according to claim 1, wherein the supporting section has:
    a first portion extending along a second axis, the second axis crossing the first axis; and
    a second portion extending from an end of the first portion, the second portion extending parallel to the first axis,
    the connector is provided in the first portion, and
    the first contact is provided in the second portion.

6. The functional device according to claim 5, wherein the first portion of the supporting section spans across the first axis,
    the second portion is configured with first and second members, the first and second members project from opposite ends of the first portion parallel to the first axis, and
    the first contact is configured with a first contact section and a second contact section, and the first and second contact sections are respectively provided within the first and second members of the second portion.

7. The functional device according to claim 1, wherein the supporting section includes a stress buffering section provided between the connector and the first contact.

8. The functional device according to claim 1, further comprising:
    a column upstanding from the surface of the substrate,
    wherein at least a part of the first contact of the supporting section is connected to a distal surface of the column.

9. The functional device according to claim 8, wherein a recess is provided in the distal surface of the column, the wire is provided on a bottom of the recess, and the first contact is aligned with the wire in a plan view.

10. The functional device according to claim 1, wherein the movable body includes a stress buffering section provided in the connector along the first axis.

11. An electronic apparatus comprising:
the functional device according to claim 1;
a display; and
a housing that houses the functional device and the display.

12. A moving object comprising:
the functional device according to claim 1;
a moving mechanism; and
a housing that houses the functional device and moving mechanism.

13. A functional device comprising:
a substrate having a surface;
a column upstanding from the surface of the substrate;
a support connected to a distal end of the column;
a connector transversely extending from the support, the connector being spaced apart from the surface of the substrate;
a torsion spring extending from the connector along a first axis, the torsion spring being spaced apart from the surface of the substrate; and
a movable body connected to the torsion spring, the movable body selectively pivoting about the first axis relative to the surface of the substrate via the torsion spring, wherein the support is connected to a distal end of the column along an axis laterally offset from the first axis.

* * * * *